United States Patent [19]

Carlson et al.

[11] B 3,914,711

[45] Oct. 21, 1975

[54] GATED OSCILLATOR HAVING CONSTANT AVERAGE D.C. OUTPUT VOLTAGE DURING ON AND OFF TIMES

[75] Inventors: Curtis Raymond Carlson, Rocky Hill; Istvan Gorog, Princeton; Philip Michael Heyman, Trenton, all of N.J.

[73] Assignee: RCA Corporation, New York, N.Y.

[22] Filed: Feb. 25, 1974

[21] Appl. No.: 445,471

[44] Published under the Trial Voluntary Protest Program on January 28, 1975 as document no. B 445,471.

[52] U.S. Cl. ............ 331/108 D; 331/111; 331/153; 331/173

[51] Int. Cl.[2] ........................................ H03K 1/14

[58] Field of Search ........ 331/108 R, 108 C, 108 D, 331/111, 172, 173, 143, 153; 328/59, 63

[56] References Cited

UNITED STATES PATENTS 3,671,881 6/1972 Yorganjian ................ 331/108 D X

OTHER PUBLICATIONS

Electronic Design, Vol. 13, June 21, 1969, pp. 84–85.
The Electronic Engineer, May 1970, p. 55.

*Primary Examiner*—Siegfried H. Grimm
*Attorney, Agent, or Firm*—H. Christoffersen; Samuel Cohen

[57] ABSTRACT

An oscillator which can be selectively started and stopped in response to a control voltage. When the oscillator is stopped, the control voltage is used to derive a voltage that is summed with the oscillator output such that the d.c. voltage level of the oscillator is the same value, both in the presence and absence of oscillations.

5 Claims, 3 Drawing Figures

GATED OSCILLATOR HAVING CONSTANT AVERAGE D.C. OUTPUT VOLTAGE DURING ON AND OFF TIMES

Gated oscillators, especially those realized from logic gate elements, are well known. These circuits often are operated by a voltage source having a single polarity and they produce signals that are unipolar with respect to a reference level. Where a pulsed bipolar signal is required, it is possible to couple the oscillator to its load through a capacitor. However, because the presence of oscillations results in an average direct current (d.c.) voltage level different from the level when oscillations are absent, the repeated charging and discharging of the aforementioned coupling capacitor could cause intolerable distortion of the gated oscillations.

The source of the distortion may be determined by analysis of the Fourier spectrum of the output waveform of a gated unipolar oscillator. In addition to spectral components centered about the frequency of oscillation, low frequency components of significant magnitude are present in this spectrum. The latter spectral components are related to the shift in average d.c. voltage levels of the oscillator output as it is repeatedly gated from an oscillating to a non-oscillating condition. To capacitively couple such a waveform to another circuit, without introducing frequency distortion, requires a large valued coupling capacitor whose frequency response would extend to very low values of frequency. The presence of such a capacitor would introduce distortion of a different nature tothe oscillator waveform. Large charging currents would flow through the capacitor each time the average d.c. voltage levels at the oscillator output shifted. Distortion of the oscillator output waveform would occur because of the loading effects of the capacitor. The present circuit was developed for an application where neither form of distortion was permissible.

In the circuit of the present application, a d.c. voltage level of fixed amplitude is present at the oscillator output whether it is oscillating or not, eliminating distortion introduced by the coupling network. The technique is inexpensive, easily implemented and compatible with integrated circuit techniques. The oscillator is connected to a summing network. The control signal employed to turn on the oscillator is also applied via a signal translator to the summing network in a sense and at a level to make the summing network output signal have the same d.c. voltage level during the period oscillations are present as when they are absent.

The Fourier spectrum of such a waveform will be centered about the frequency of oscillation. With the low frequency spectral components no longer present, the signal may now be coupled to another network with a capacitor of much lower value than that required for the original unipolar oscillations. In addition, since the average d.c. voltage across this capacitor will be constant both in the presence and absence of oscillations, no distortion will occur because of large values of charging current flowing through this capacitor.

The invention is discussed in detail below and is described in the drawing of which:

In the following discussion, the binary digit (bit) 1 is represented by a voltage V; the bit 0 is represented by ground level. This convention is purely arbitrary. For the sake of simplification of the explanation which follows, rather than referring to a signal which represents a bit, the bit itself is sometimes referred to. The voltage V may be the operating level Vcc (not shown explicitly) employed to operate the NAND gates.

Figure 1:
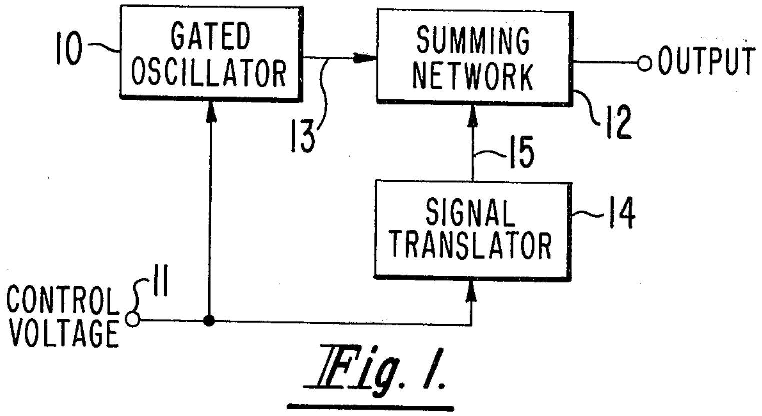
FIG. 1 is a block diagram of the invention.

The circuit of FIG. 1 includes a gated oscillator 10 which when gated on by the control voltage applied to the circuit input terminal 11, produces oscillations having an average d.c. voltage level other than a reference voltage level (ground). These oscillations are applied to a first input terminal 13 to a summing network 12. The control voltage is also applied to a signal translator 14 connected to the second input terminal 15 of the summing network 12. The signal translator 14 supplies to the network 12, during the periods the control voltage turns the oscillator off, a voltage of a sense and amplitude to cause the summing network to produce the same d.c. voltage level as is present when the oscillator is on.

Figure 2:
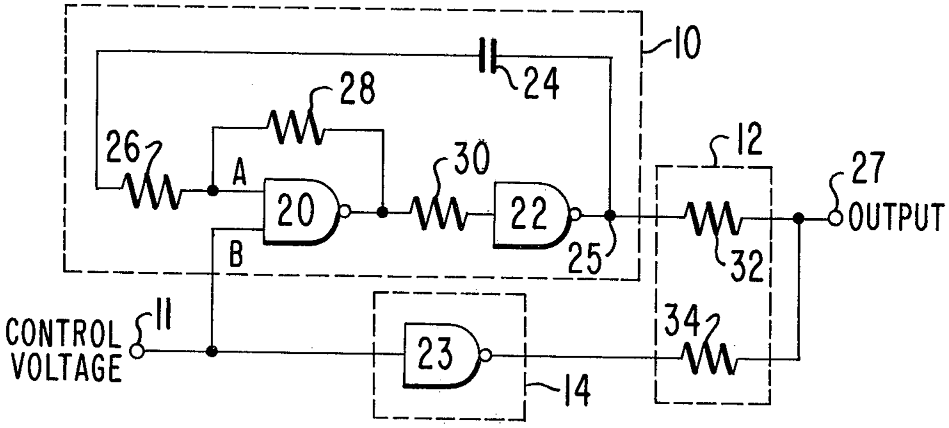
FIG. 2 is a schematic circuit diagram of a preferred embodiment of the invention.

A preferred implementation of the circuit of FIG. 1 is illustrated in FIG. 2. The oscillator 10 shown within the dashed block is conventional. It includes two NAND gates 20 and 22, the first connected at input terminal B to receive the control voltage applied to terminal 11 and connected at its output terminal through resistor 30 to the second NAND gate 22. The second NAND gate is a one input gate and performs the function of a simple binary inverter. The output terminal 25 of NAND gate 22 is connected back to the second input terminal A of NAND gate 20 via the feedback path comprising capacitor 24 and resistor 26. Resistor 28 connects between input terminal A and the output terminal of NAND gate 20.

When the control voltage is at the 0 level, the oscillator is inhibited. The reason is that this causes the output of gate 20 to be clamped to the 1 level, regardless of the polarity of the signal at terminal A. This causes the output of gate 22 to be held at the 0 level.

When the control voltage is at the 1 level, the oscillator is enabled. The 1 level primes gate 20 and the output signal of gate 20 becomes equal to the complement of the signal present at its A terminal. This output signal is inverted once by gate 22 and the oscillator output appears at the output terminal of this gate.

Oscillations are produced in the following manner. Assume that the control voltage is at the 1 level, enabling the oscillator. Further, arbitrarily assume that the output of gate 20 is at the 1 level. This means that terminal A of gate 20 and the output terminal of gate 22 are at the 0 level. Capacitor 24 will begin to charge through a charging path comprising resistors 26 and 28 and the output impedance (not shown) of gate 22 towards the 1 level voltage present at the output of gate 20. When the voltage at terminal A becomes sufficiently positive, gate 20 changes its state, causing its output to drop to the 0 level. This changes the output state of gate 22 to the 1 level. Since the voltage across a capacitor cannot change instantaneously, the output of gate 22 is coupled to gate 20, making terminal A more positive. Capacitor 24 will now discharge towards the 0 level present at the output of gate 20. When the voltage at terminal A drops to the transition point, gate 20 changes state, its output becoming high and the output of gate 22 becoming low. The capacitor will now charge towards the bit 1 level present at the gate 20 output, causing oscillations to continue for as long as the control voltage is at the 1 level. These oscillations are applied to resistor 32 of the summing network. The frequency of the oscillations is controlled by the time values of capacitor 24 and resistors 26 and 28. Resistors 26 and 30 are present at the gate inputs because of loading considerations of the gates used.

Figure 3:
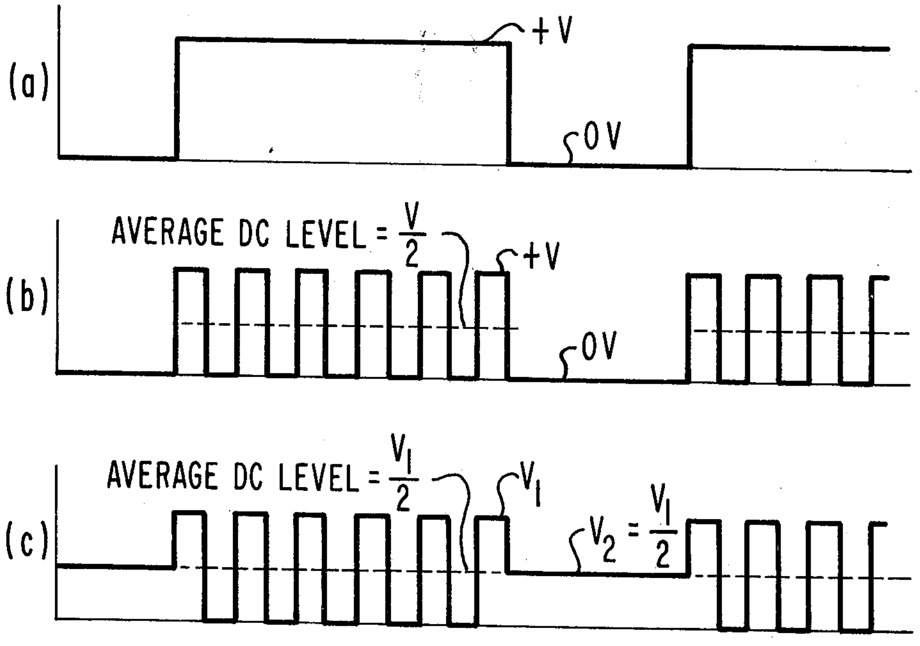
FIG. 3 is a schematic diagram of waveforms present in the circuit of FIG. 2.

The operation of the circuit just described is illustrated in FIG. 3 at A and B. FIG. 3(B) shows the oscillator output when it is operated in conventional manner, that is as though elements 32, 34 and 23 were disconnected. Note that during the oscillating period, the average d.c. voltage level is V/2 (one half of the square wave amplitude) and during the period between oscillations the d.c. voltage level drops to ground (the binary 0 level). As noted in the introductory portion of this application, in certain applications this is highly undesirable in that the transition in d.c. levels from V/2 to ground (and vice versa) introduces a low frequency component into the Fourier spectrum of the oscillator output waveform, complicating the coupling of the oscillator output with circuits following the oscillator.

The addition of the present application to the conventional circuit above to eliminate this d.c. level shift is the signal translator 14 and summing network 12. The signal translator consists of a one input NAND gate 23 which operates as a binary inverter. The input terminal 11 for the control voltage connects to the input terminal of NAND gate 23 and the output terminal connects to resistor 34 of the summing network. The output terminal 25 of the gated oscillator 10 connects to resistor 32 of the summing network. Both resistors are connected at their other terminal to the output terminal 27 of the circuit.

In the operation of the circuit of FIG. 2, when the control voltage represents a 1 priming gate 20 and causing the oscillator 10 to oscillate, gate 23 applies a 0 to the summing network resistor 34. Resistor 34 now operates as one leg of a voltage divider 32, 34 so that the amplitude of the oscillations $V_1$ is lower than it would be in the absence of the summing network. The oscillations however still are unipolarity oscillations and the average d.c. voltage level of these oscillations is $V_1/2$, shown in FIG. 3(C). When the control voltage changes to a 0 inhibiting gate 20 so that the oscillations cease, gate 23 produces an output representing a 1. Gate 20 produces an output representing a 1 so that gate 22 produces an output representing a 0. Now, resistors 34, 32 operate as a voltage divider. The value of resistor 34 is so chosen in relationship to resistor 32 and the other circuit elements (not shown) connected between output terminal 27 and ground, that the d.c. voltage level present at output terminal 27 is also $V_1/2$, precisely the same value as the average d.c. voltage level of the oscillations (when they are present) present at terminal 27. Thus, the d.c. voltage level at output terminal 27 remains of the same fixed value both during the time oscillator 20 is producing oscillations and during the time the oscillator is in its off condition.

An embodiment such as shown in FIG. 2 may be realized using an integrated circuit, where gates 20, 22 and 23 are contained in a single package and where the three gates are essentially identical (gates 22 and 23 being gates with two inputs similar to 20 but with one input lead, not shown, continuously held at a level representing a 1). In such an embodiment, the values of resistors 32 and 34 were found to equal approximately 1,000 ohms and 2,500 ohms, respectively. Since the d.c. voltage level at the output terminal of gate 23 when at the 1 level is two times the average d.c. voltage level at the oscillator output terminal 25 when oscillations are present, the relative value actually obtained for resistors 32 and 34 is close to the anticipated value. Other resistor values were found to be approximately 200, 500 and 200 ohms for resistors 26, 28 and 30 respectively, while the approximate value of capacitor 24 was 20 picofarads. The techniques presented are not limited to square wave oscillators as discussed herein but can be used with oscillators having outputs of any duty cycle and waveform complexity.

What is claimed is:

1. In combination:

an oscillator;

means for applying a control voltage to the oscillator for causing the latter to produce oscillations at an average d.c. voltage level other than a reference voltage level;

a summing circuit to which said oscillations are applied; and means responsive to said control voltage when it is at a level to terminate said oscillations for applying to said summing circuit a voltage at a level such that it causes the summing circuit to produce a d.c. voltage level in the absence of said oscillations which is equal to that it produces during the presence of said oscillations.

2. The combination recited in claim 1 wherein said oscillator comprises:

a plurality of logic gate circuits each having at least one input terminal and an output terminal, the output terminal of each logic gate circuit coupled to the input terminal of the following logic gate circuit, and said logic gate circuits interconnected in a ring;

a second input terminal at one of said logic gate circuits to which said control voltage is applied; and an oscillator output terminal comprising the output terminal of one of said logic gate circuits.

3. The combination recited in claim 1 wherein said means responsive to the level of said control voltage comprises:

a signal translator having an input and an output terminal, said control voltage being applied to said input terminal, and said output terminal being connected to said summing network.

4. The combination recited in claim 1 wherein said summing circuit comprises:

an impedance coupling the output terminal of said oscillator to a circuit output terminal; and an impedance coupling the output terminal of said signal translator to said circuit output terminal.

5. In combination:

a logic gate oscillator comprising a first logic gate having an input terminal to which a control voltage may be applied for priming that gate and having also a feedback loop including a binary inverter connected between the output terminal of said logic gate and a second input terminal of that logic gate, the output terminal of said oscillator being coupled to the output terminal of said inverter, whereby when said oscillator is turned on, the oscillations at said output terminal are at an average d.c. voltage level other than a reference voltage level;

a second binary inverter similar to the said first inverter and receptive of said control voltage, said second inverter producing an output voltage level other than said reference voltage level when said control voltage is at a value to turn said oscillator off; and a summming network receptive of the output of both inverters for producing, in response to said oscillations, an average d.c. voltage level at its output terminal of a given value, and for producing, in response to the output of said second inverter and the absence of said oscillations, at the summing network output terminal a d.c. voltage level of the same value as produced during said oscillations.

* * * * *